United States Patent
Kim et al.

(10) Patent No.: US 7,847,287 B2
(45) Date of Patent: Dec. 7, 2010

(54) INVERTER, LOGIC CIRCUIT INCLUDING AN INVERTER AND METHODS OF FABRICATING THE SAME

(75) Inventors: Sang-wook Kim, Suwon-si (KR); Young-soo Park, Seoul (KR); Jae-chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/232,854

(22) Filed: Sep. 25, 2008

(65) Prior Publication Data
US 2009/0242992 A1   Oct. 1, 2009

(30) Foreign Application Priority Data
Mar. 28, 2008   (KR) .............. 10-2008-0029327

(51) Int. Cl.
*H01L 29/12* (2006.01)
*H01L 23/62* (2006.01)
(52) U.S. Cl. ............. 257/43; 257/360; 257/E29.296; 257/E23.001
(58) Field of Classification Search ........... 257/43, 257/392, E29.296, 360, E23.001; 438/104, 438/149
See application file for complete search history.

(56) References Cited

U.S. PATENT DOCUMENTS

| | | | |
|---|---|---|---|
| 6,927,535 B2 * | 8/2005 | Choi et al. ................ | 313/504 |
| 2007/0001186 A1 * | 1/2007 | Murai et al. .............. | 257/98 |
| 2007/0278490 A1 * | 12/2007 | Hirao et al. ............... | 257/64 |
| 2008/0024055 A1 * | 1/2008 | Marks et al. .............. | 313/504 |
| 2008/0073653 A1 * | 3/2008 | Iwasaki .................... | 257/79 |
| 2009/0057663 A1 * | 3/2009 | Kim et al. ................. | 257/43 |

FOREIGN PATENT DOCUMENTS

WO   WO 2008143304 A1 * 11/2008

* cited by examiner

*Primary Examiner*—David S Blum
(74) *Attorney, Agent, or Firm*—Harness, Dickey & Pierce, P.L.C.

(57) ABSTRACT

An inverter, a logic circuit including the inverter and method of fabricating the same are provided. The inverter includes a load transistor of a depletion mode, and a driving transistor of an enhancement mode, which is connected to the load transistor. The load transistor may have a first oxide layer as a first channel layer. The driving transistor may have a second oxide layer as a second channel layer.

10 Claims, 7 Drawing Sheets

INVERTER, LOGIC CIRCUIT INCLUDING AN INVERTER AND METHODS OF FABRICATING THE SAME

PRIORITY STATEMENT

This application claims the benefit of priority to 35 U.S.C. §119 from Korean Patent Application No. 10-2008-0029327, filed on Mar. 28, 2008, in the Korean Intellectual Property Office, the disclosure of which is incorporated herein in its entirety by reference.

BACKGROUND

1. Field

Example embodiments relate to a semiconductor device. Other example embodiments relate to an inverter, a logic circuit including the inverter and methods of fabricating the same.

2. Description of the Related Art

Logic circuits (e.g., not-and (NAND) circuits and not-or (NOR) circuits) are used in various semiconductor integrated circuits (e.g., dynamic random access memories (DRAM), static random access memories (SRAM), non-volatile memories, liquid crystal display (LCD) devices, organic light emitting display (OLED) devices and the like. An inverter is the base of the logic circuits.

In general, a silicon (Si)-based inverter may be a complementary metal-oxide semiconductor (CMOS) inverter, which includes both an n-channel metal-oxide semiconductor (NMOS) transistor and a p-channel metal-oxide semiconductor (PMOS) transistor. If a silicon (Si) layer is used as a channel layer, the NMOS or the PMOS transistor may be easily fabricated by doping different kinds of elements into the channel layer. Thus, it may be easier to fabricate the CMOS inverter. For example, if a III-group element (e.g., boron (B)) is doped into the Si layer, the Si layer becomes the p-channel layer.

If the channel layer is formed of an oxide semiconductor, it may be difficult to form the p-channel layer due to the properties of the material formed of the oxide semiconductor. Most of the channel layers formed of the oxide semiconductor are n-channel layers. If a transistor having a channel layer formed of an oxide semiconductor is used, it may be difficult to form the inverter having both the n-channel transistor and the p-channel transistor.

SUMMARY

Example embodiments relate to a semiconductor device. Other example embodiments relate to an inverter, a logic circuit including the inverter and methods of fabricating the same.

Example embodiments provide an inverter including an oxide semiconductor transistor, and a logic circuit including the inverter.

According to example embodiments, there is provided an inverter including a load transistor of a depletion mode, which has a first oxide layer as a first channel layer, and a driving transistor of an enhancement mode, which is connected to the load transistor and has a second oxide layer as a second channel layer.

The inverter may include a barrier layer between the second oxide layer and a source electrode and a drain electrode. The source and drain electrodes may correspond to the second oxide layer. The barrier layer may have a work function greater than that of the second oxide layer.

The barrier layer may be one selected from the group consisting of a titanium (Ti) oxide layer, a copper (Cu) oxide layer, a nickel (Ni) oxide layer, a Ni oxide layer doped with Ti, a ZnO-based oxide layer, a ZnO-based oxide layer doped with at least one of I, II and V-group elements, a ZnO-based oxide layer doped with silver (Ag) and combinations and alloys thereof.

The first oxide layer and the second oxide layer may be formed of layers of the same material. The first oxide layer and the second oxide layer may have different carrier concentrations. The carrier concentration of the second oxide layer may be lower than that of the first oxide layer.

A surface of the first oxide layer may be treated with plasma such that the first oxide layer has an electric conductivity higher than that of the second oxide layer.

The surface of the first oxide layer may be treated with argon (Ar) plasma. At least one of the first oxide layer and the second oxide layer may comprise (or include) a ZnO-based material.

At least one of the load transistor and the driving transistor may be a thin film transistor having a bottom gate structure. At least one of the load transistor and the driving transistor may be a thin film transistor having a top gate structure.

According to example embodiments, there is provided a logic circuit including the inverter as described above.

The logic circuit may include at least one of a not-and (NAND) circuit, a not-or (NOR) circuit, an encoder, a decoder, a multiplexer (MUX), a demultiplexer (DEMUX), a sense amplifier or a similar device The logic circuit may include one or more inverters.

BRIEF DESCRIPTION OF THE DRAWINGS

Example embodiments will be more clearly understood from the following detailed description taken in conjunction with the accompanying drawings.

FIG. 1 is a circuit diagram of an inverter according to example embodiments;

FIGS. 2 through 7 are diagrams illustrating cross-sectional views of inverters according to example embodiments;

FIG. 8 is a graph showing a gate voltage (Vg)—drain current (Id) characteristic of a load transistor in an inverter according to example embodiments;

FIG. 9 is a graph showing a Vg-Id characteristic of a driving transistor in an inverter according to example embodiments;

FIG. 10 is a graph showing an input voltage (VI)-output voltage (VO) characteristic of the inverter according to example embodiments; and FIG. 11A through 11D are diagrams illustrating cross-sectional views of a method of fabricating an inverter according to example embodiments.

DETAILED DESCRIPTION OF EXAMPLE EMBODIMENTS

Figure 1:
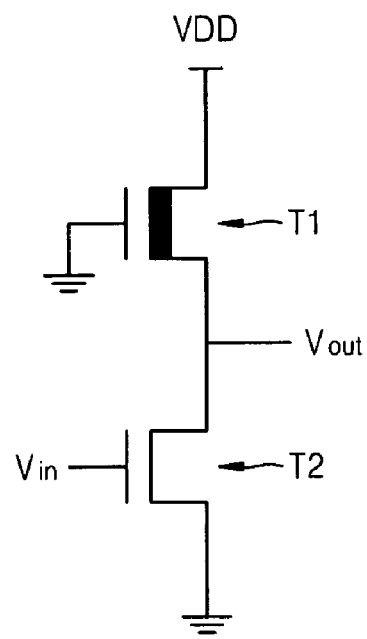
FIGS. 1-10, 11A-11D represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device. Other example embodiments relate to an inverter, a logic circuit including the inverter and methods of fabricating the same.

FIG. 1 is a circuit diagram of an inverter according to example embodiments.

Referring to FIG. 1, a load transistor T1 and a driving transistor T2 are connected to each other. The load transistor T1 and the driving transistor T2 may be transistors each having an oxide semiconductor layer as a channel layer. That is, the load transistor T1 and the driving transistor T2 may be oxide semiconductor transistors. The load transistor T1 may be a depletion mode transistor. The driving transistor T2 may be an enhancement mode transistor.

If a gate voltage is 0V, the depletion mode transistor is in an ON state. In the ON state, an electric current is greater than a current level that is not substantially ignorable. The enhancement mode transistor is in an OFF state if the gate voltage is 0V. The threshold voltage of the depletion mode transistor may be smaller than 0V, and a threshold voltage of the enhancement mode transistor may be greater than 0V.

A power source VDD may be connected to a drain electrode of the load transistor T1. An input terminal $V_{in}$ may be connected to a gate electrode of the driving transistor T2. An output terminal $V_{out}$ may be commonly connected to a source electrode of the load transistor T1 and a drain electrode of the driving transistor T2. A gate electrode of the load transistor T1 and a source electrode of the driving transistor T2 may be grounded.

If a voltage of 0V is applied to the input terminal $V_{in}$ (i.e., the driving transistor T2 is turned off), and if the power source VDD applies a substantially high level power voltage to the drain electrode of the load transistor T1, a substantially high level voltage is detected at the output terminal $V_{out}$. If the power voltage applied to the drain electrode of the load transistor T1 is fixed, and if the driving transistor T2 is turned on by applying a voltage that is higher than the threshold voltage of the driving transistor T2 to the input terminal $V_{in}$, a substantial amount of the electric current flows through the driving transistor T2 to the ground. A voltage of a low level is detected at the output terminal $V_{out}$. The voltage output from the output terminal $V_{out}$ may vary according to the voltage applied to the input terminal $V_{in}$ if the power voltage is fixed.

Figure 2:
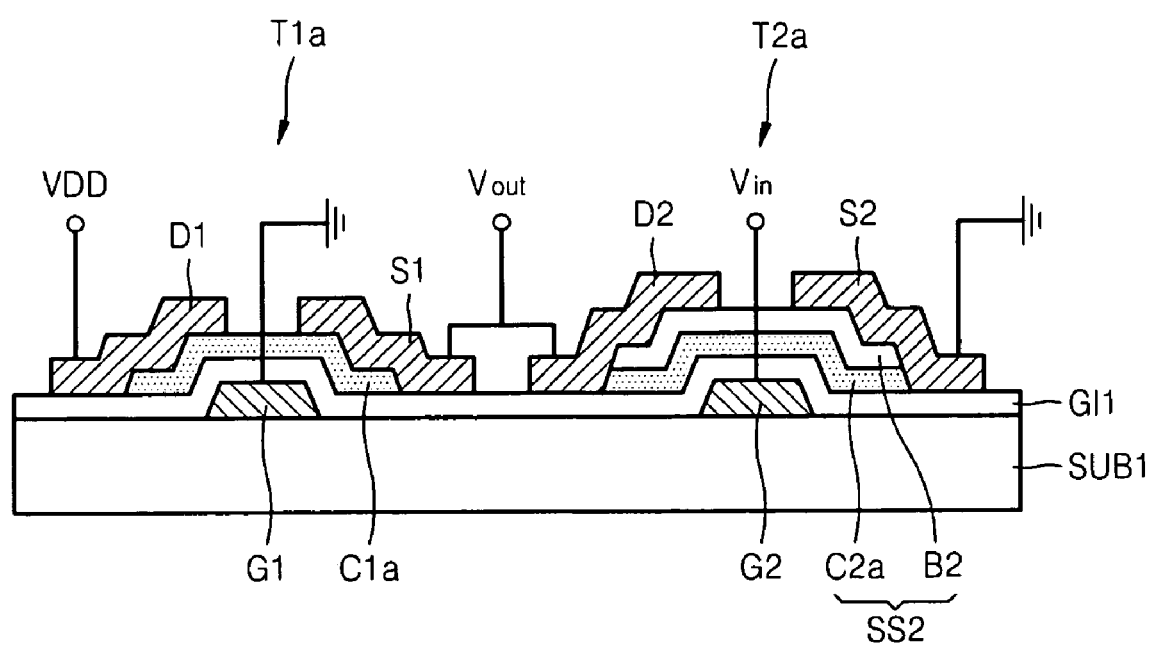

FIG. 2 is a diagram illustrating a cross-sectional view of an inverter according to an example embodiments.

Referring to FIG. 2, a load transistor T1a that is a depletion mode transistor and a driving transistor T2a that is an enhancement mode transistor may be disposed on a substrate SUB1. The load transistor T1a and the driving transistor T2a may each be thin film transistors each having a bottom gate structure.

A first gate electrode G1 and a second gate electrode G2 may be formed on the substrate SUB1 and separated from each other. A gate insulating layer GI1 may be disposed on the substrate SUB1 so as to cover the first and second gate electrodes G1 and G2. A first channel layer C1a may be disposed on the gate insulating layer GI1 above the gate electrode G1. A second channel layer C2a may be disposed on the gate insulating layer GI1 above the second gate electrode G2.

Each of the first and second channel layers C1a and C2a may include an oxide semiconductor. The oxide semiconductor may be a ZnO-based oxide semiconductor (e.g., ZnO, InZnO, GaInZnO, or ZnSnO). Each of the first and second channel layers C1a and C2a may include at least one transition metal selected from the group consisting of hafnium (Hf), chromium (Cr), tantalum (Ta), yttrium (Y), titanium (Ti), zirconium (Zr) and combinations thereof. The first and second channel layers C1a and C2a may be formed of the same material.

A barrier layer B2 having a work function that is greater than that of the second channel layer C2a may be formed on the second channel layer C2a. A material forming the barrier layer B2 may vary according to the material forming the second channel layer C2a. For example, the barrier layer B2 may be one selected from the group consisting of a ZnO-based oxide layer having a work function that is greater than that of the second channel layer C2a, a Ti oxide layer, a Cu oxide layer, a Ni oxide layer, a Ti-doped Ni oxide layer, a ZnO-based oxide layer doped with at least one of a I-group element, a II-group element and a V-group element, a ZnO-based oxide layer doped with silver (Ag) and combinations thereof. However, the material forming the barrier layer B2 is not limited to the above examples.

The second channel layer C2a and the barrier layer B2 may have similar shapes to each other as seen from a top view (e.g., from above). Hereinafter, a double-layered structure including the second channel layer C2a and the barrier layer B2 is referred to as a "stacked structure SS2."

The first channel layer C1a and the stacked structure SS2 will now be described in greater detail.

A single layer (not shown) is formed on a part of the gate insulating layer GI1, and a dual layer (not shown) is formed on another part of the gate insulating layer GI1. The single layer and the dual layer are patterned to form the first channel layer C1a from the single layer and the stacked structure SS2 from the dual layers.

In other example embodiments, a single layer (not shown) is formed on an entire surface of the gate insulating layer GI1. A part of the single layer is changed to a dual-layered structure (not shown). The dual-layered structure, and the remaining portion of the single layer (which was not changed to the dual-layered structure) are patterned to form the stacked structure SS2 and the first channel layer C1a, respectively. As such, the thicknesses of the first channel layer C1a and the stacked structure SS2 may be equal, or similar, to each other.

A first source electrode S1 and a first drain electrode D1, which each contact respective ends of the first channel layer C1a, may be formed on the gate insulating layer GI1. A second source electrode S2 and a second drain electrode D2, which each contact respective ends of the barrier layer B2, may be formed on the gate insulating layer GI1. The first source electrode S1 and the second drain electrode D2 may be separated from each other, or may be integrally formed.

Although not shown in the drawings, a passivation layer covering the first channel layer C1a, the first source electrode S1, the first drain electrode D1, the barrier layer B2, the second source electrode S2, and the second drain electrode D2 may be formed on the gate insulating layer GI1.

The first gate electrode G1, the first channel layer C1a, the first source electrode S1, and the first drain electrode D1 may configure (or define) the load transistor T1a. The second gate electrode G2, the second channel layer C2a, the barrier layer B2, the second source electrode S2, and the second drain electrode D2 may configure (or define) the driving transistor T2a.

Because the barrier layer B2 having a larger work function than that of the second channel layer C2a is interposed between the second channel layer C2a and the second source electrode S2 and between the second channel layer C2a and the second drain electrode D2, a threshold voltage of the driving transistor T2a may be higher than that of the load transistor T1a. As such, the driving transistor T2a may be an enhancement mode transistor and the load transistor T1a may be a depletion mode transistor.

The power source VDD is connected to the first drain electrode D1. The input terminal $V_{in}$ may be connected to the second gate electrode G2. The output terminal $V_{out}$ may be commonly connected to the first source electrode S1 and the second drain electrode D2. The first gate electrode G1 and the second source electrode S2 may be grounded.

Figure 3:
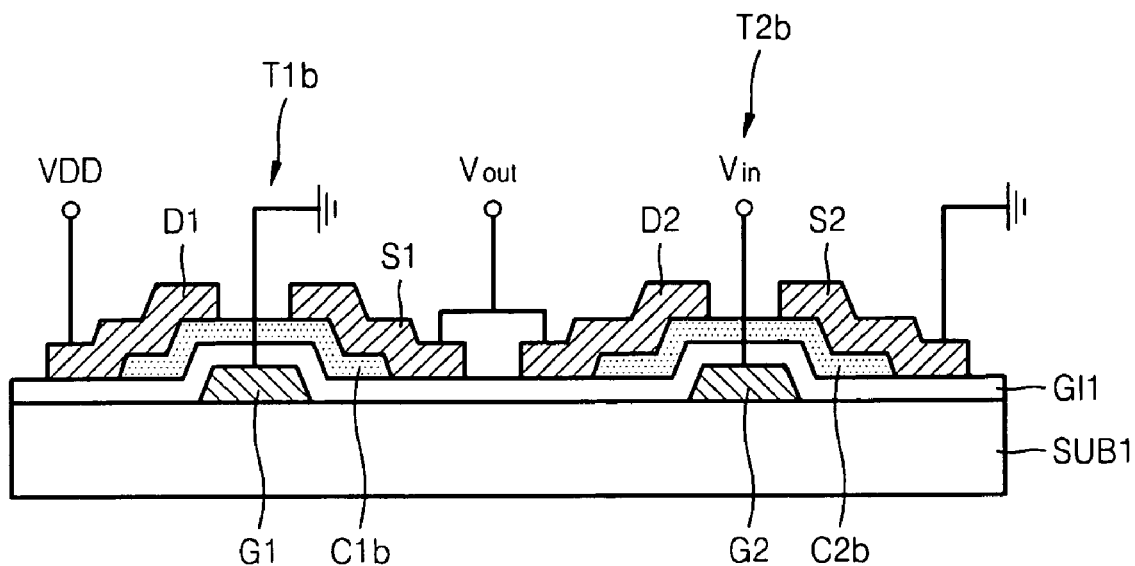

FIG. 3 shows an inverter according to example embodiments.

The inverter shown in FIG. 3 is similar to the inverter shown in FIG. 2, except driving transistor T2b does not include a barrier layer B2 as shown in FIG. 2. As such, the second source electrode S2 and the second drain electrode D2 directly contact respective ends of a second channel layer C2b. Furthermore, in FIGS. 2 and 3, like reference numerals denote similar elements, and thus, detailed descriptions of similar elements are omitted for the sake of brevity.

Referring to FIG. 3, the composition and the carrier concentration of the second channel layer C2b may be different from that of a first channel layer C1b. For example, the first channel layer C1b and the second channel layer C2b may be GaInZnO layers each having different gallium (Ga) doping densities and/or different indium (In) doping densities. The carrier concentration of the second channel layer C2b may be lower than that of the first channel layer C1b. Due to the difference between the carrier concentrations, a threshold voltage of the driving transistor T2b may be higher than that of the load transistor T1b. As such, the driving transistor T2b may be the enhancement mode transistor and the load transistor T1b may be the depletion mode transistor.

Figure 4:
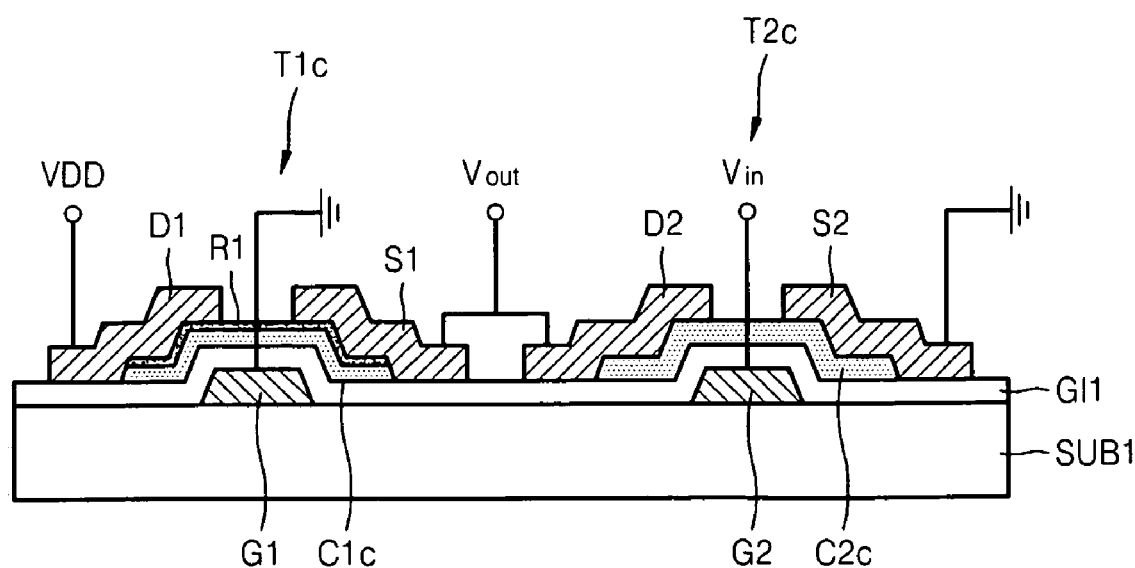

Each of the first channel layer C1b and the second channel layer C2b may include an oxide semiconductor other than GaInZnO. The oxide semiconductor may be a ZnO-based oxide semiconductor (e.g., ZnO, InZnO, ZnSnO and combinations thereof). Each of the first channel layer C1b and the second channel layer C2b may include at least one transition metal selected from the group consisting of hafnium (Hf), chromium (Cr), tantalum (Ta), yttrium (Y), titanium (Ti), zirconium (Zr) and combinations thereof. FIG. 4 shows an inverter according to example embodiments.

The inverter shown in FIG. 4 is similar to the inverter shown in FIG. 3, except that the first channel layer C1c includes a low resistive region R1. Thus, in FIGS. 2, 3 and 4, like reference numerals denote the same elements, and detailed descriptions for the same elements are omitted for the sake of brevity.

Referring to FIG. 4, a first channel layer C1c may include a low resistive region R1 on a surface thereof. The low resistive region R1 may be a region treated with plasma (e.g., argon (Ar) plasma). The low resistive region R1 (the region treated with the Ar plasma) may have a plurality of defects that may operate as carriers. An electrical resistance of the low resistive region R1 (the region treated with the Ar plasma) may be lower than that of the remaining region of the first channel layer C1c untreated with the Ar plasma.

The first channel layer C1c and a second channel layer C2c may be formed of the same material. A first layer and a second layer, which are formed of the same oxide semiconductor, may be formed. A surface of the first layer may be selectively treated with the Ar plasma to form the first channel layer C1c. The second layer that is not treated with the Ar plasma may be the second channel layer C2c.

Figure 5:
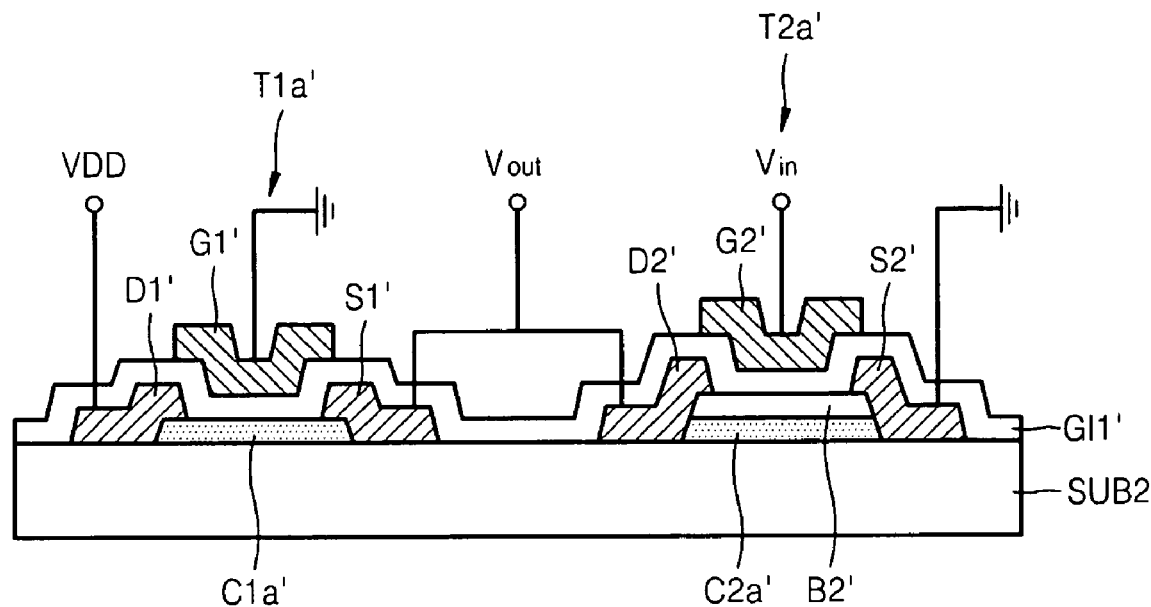
Figure 6:
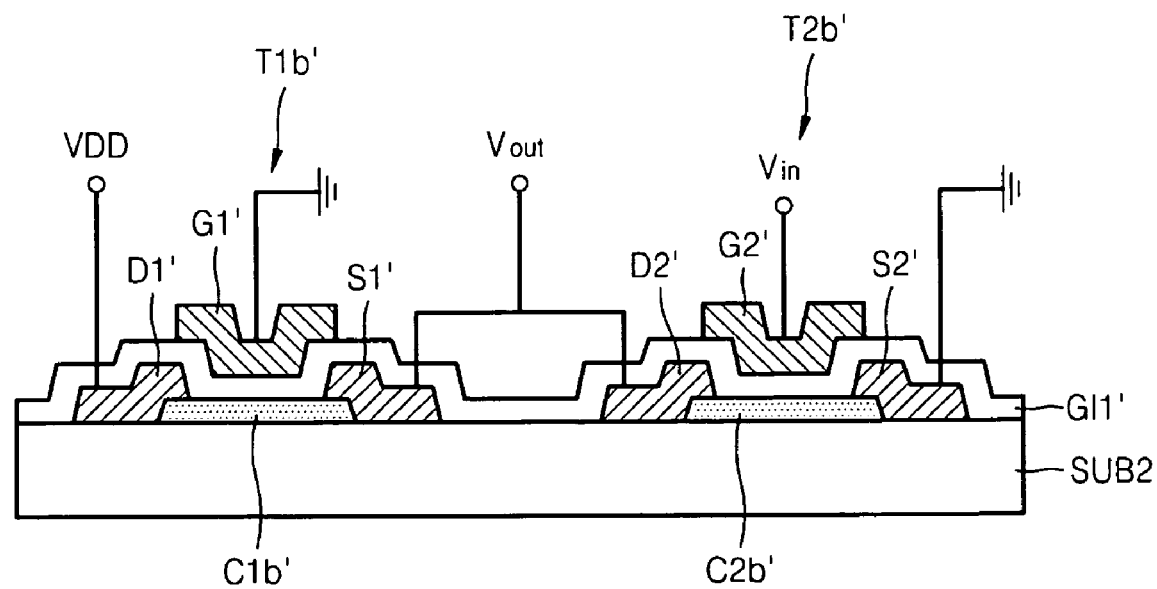
Figure 7:
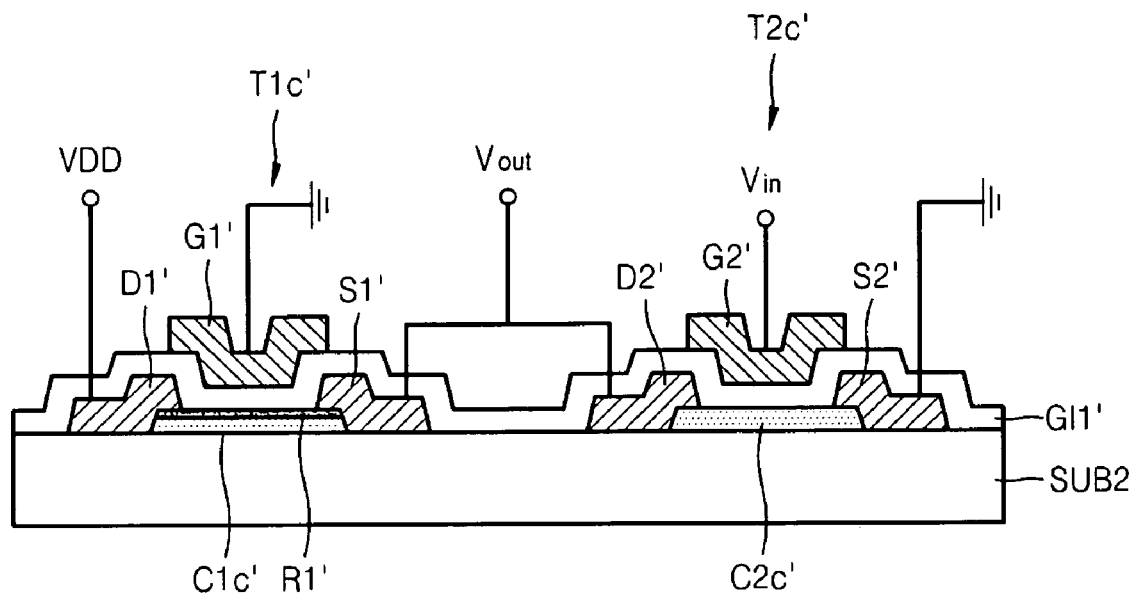

The low resistive region R1 may exists throughout (or be formed on) the entire surface of the first channel layer C1c, as shown in FIG. 4. However, the low resistive region R1 may be formed on a portion of the surface of the first channel layer C1c. Because the first channel layer C1c has the low resistive region R1, the first channel layer C1c has a threshold voltage that is lower than that of the second channel layer C2c. As such, the load transistor T1c may be the depletion mode transistor, and the driving transistor T2c may be the enhancement mode transistor. In FIGS. 2 through 4, the load transistor T1 and the driving transistor T2 of FIG. 1 have a bottom gate structure. However, example embodiments are not limited thereto. The load transistor T1 and the driving transistor T2 of FIG. 1 may have a top gate structure. As illustrated in FIGS. 5-7, the load transistors T1a, T1b, and T1c and the driving transistors T2a, T2b, and T2c shown in FIGS. 2 through 4 have a top gate structure.

Referring to FIG. 5, a first channel layer C1a' and a second channel layer C2a' that are separated from each other may be disposed on a substrate SUB2. A barrier layer B2' may be disposed on the second channel layer C2a'. The first and second channel layers C1a' and C2a' and the barrier layer B2' correspond (or are similar) to the first and second channel layers C1a and C2a and the barrier layer B2 of FIG. 2, respectively. A work function of the barrier layer B2' may be greater than that of the second channel layer C2a'.

A first source electrode S1' and a first drain electrode D1', which contact respective ends of the first channel layer C1a', may be disposed on the substrate SUB2. A second source electrode S2' and a second drain electrode D2', which contact respective ends of the barrier layer B2' and the second channel layer C2a', may be disposed on the substrate SUB2.

A gate insulating layer GI1' covering the first channel layer C1a', the first source electrode S1', the first drain electrode D1', the barrier layer B2', the second source electrode S2', and the second drain electrode D2' may be disposed on the substrate SUB2.

A first gate electrode G1' may be disposed on the gate insulating layer GI1' above the first channel layer C1a'. A second gate electrode G2' may be disposed on the gate insulating layer GI1' above the second channel layer C2a'.

The first gate electrode G1', the first channel layer C1a', the first source electrode S1', and the first drain electrode D1' may configure (or define) a load transistor T1a'. The second gate electrode G2', the second channel layer C2a', the barrier layer B2', the second source electrode S2', and the second drain electrode D2' may configure (or define) a driving transistor T2a'. The load transistor T1a' may be the depletion mode transistor and the driving transistor T2a' may be the enhancement mode transistor.

The power source VDD may be connected to the first drain electrode D1'. The input terminal $V_{in}$ may be connected to the second gate electrode G2'. The output terminal $V_{out}$ may be commonly connected to the first source electrode S1' and the second drain electrode D2'. The first gate electrode G1' and the second source electrode S2' may be grounded.

In the same manner that the structure shown in FIG. 2 may be modified to the structure shown in FIG. 5, the structures of the inverters shown in FIGS. 3 and 4 may be modified into structures shown in FIGS. 6 and 7, respectively.

In FIG. 6, first and second channel layers C1b' and C2b' may correspond to the first and second channel layers C1b and C2b, respectively, of FIG. 3. Reference numerals T1b' and T2b' denote a load transistor and a driving transistor, respectively. First and second channel layers C1c' and C2c' and a low resistive region R1' of FIG. 7 correspond to the first and second channel layers C1c and C2c and the low resistive region R1, respectively, of FIG. 4. Reference numerals T1c' and T2c' of FIG. 7 denote the load transistor and the driving transistor, respectively.

Figure 8:
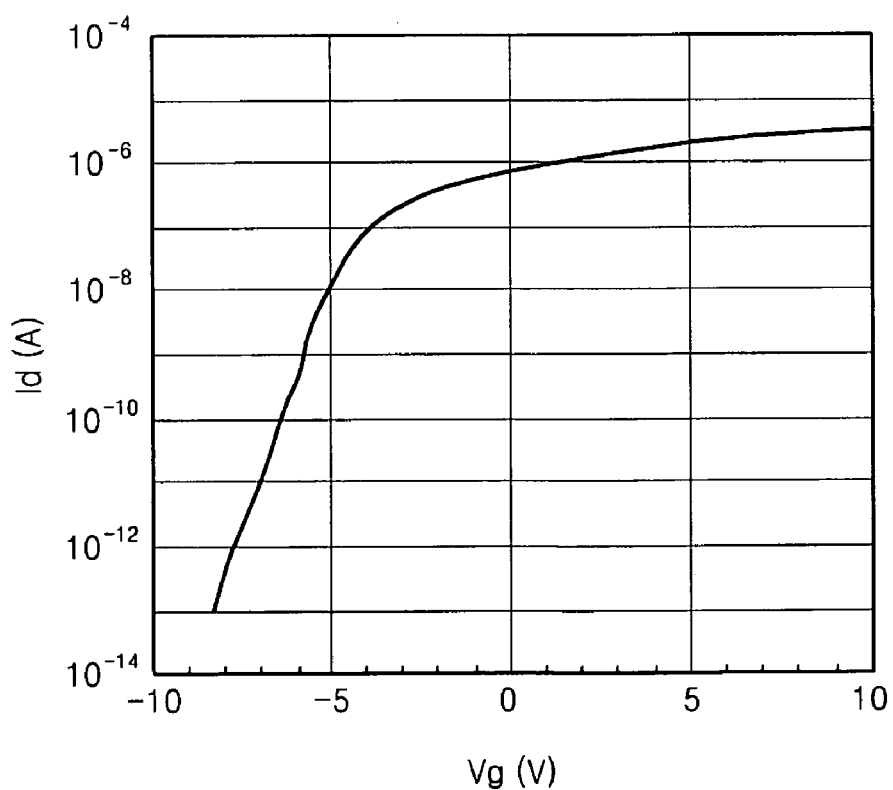

FIG. 8 is a graph showing a gate voltage (Vg)-drain current (Id) characteristic of a load transistor in an inverter according to example embodiments.

Referring to FIG. 8, if Vg is 0V, a high level ON-current flows. As such, the load transistor according to example embodiments is a depletion mode transistor.

Figure 9:
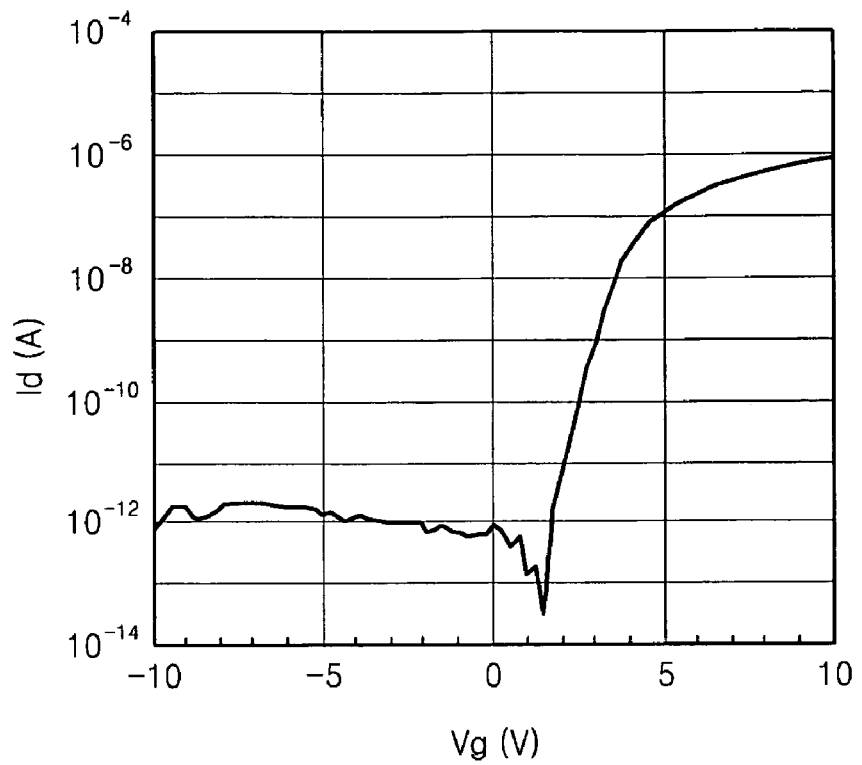

FIG. 9 is a graph showing a Vg-Id characteristic of a driving transistor in an inverter according to example embodiments.

Referring to FIG. 9, if Vg is 0V, an OFF-current of a low level flows. As such, the driving transistor according to example embodiments is an enhancement mode transistor.

Figure 10:
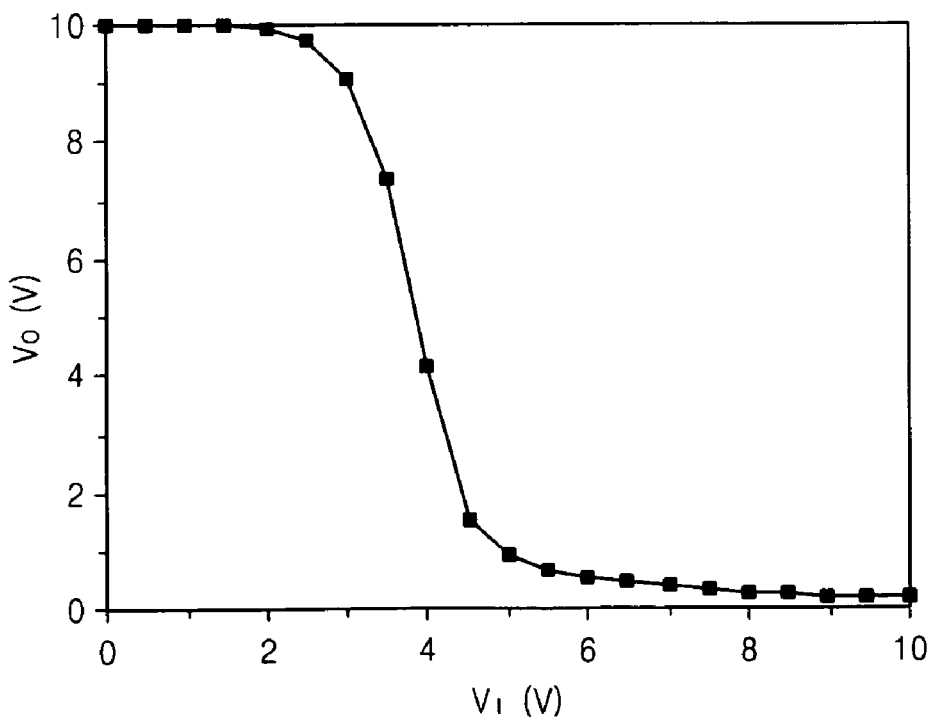

FIG. 10 is a graph showing an input voltage (VI)-output voltage (VO) characteristic of an inverter according to example embodiments. The power source voltage used to obtain the result of FIG. 10 was about 10V. The input voltage $V_I$ and the power source voltage are voltages applied to the input terminal $V_{in}$ and the power source VDD of FIG. 1, respectively. The output voltage $V_O$ is the voltage detected at the output terminal $V_{out}$ of FIG. 1.

Referring to FIG. 10, if the input voltage $V_I$ is 0V, the output voltage $V_O$ is at a high level similar to the power source voltage. If the input voltage $V_I$ increases to 4.5V or higher, the output voltage $V_O$ decreases to nearly 0V. As such, a full swing property at a level similar to that of a Si-based CMOS inverter may be obtained using the inverter according to example embodiments.

The conventional Si-based CMOS inverter requires a process of implanting conductive impurities as ions into the Si layer. However, the inverter according to example embodiments may be fabricated without performing the ion implantation process that makes the fabrication costs increase and the fabrication processes more complex. Therefore, according to example embodiments, an inverter having similar characteristics as that of the conventional CMOS inverter may be fabricated by performing an easier process with lower fabrication costs.

The inverters according to example embodiments may be used as a basic device in various logic circuits (e.g., NAND circuits, NOR circuits, encoders, decoders, multiplexers (MUXs), demultiplexers (DEMUXs), sense amplifiers or the like). Basic structures of the logic circuits are well known in the art, and thus, their descriptions are omitted.

A logic circuit according to example embodiments may include one or more inverters.

Hereinafter, a method of fabricating the inverter of FIG. 2 according to example embodiments will be described with reference to FIGS. 11A through 11D.

Figure 11A:
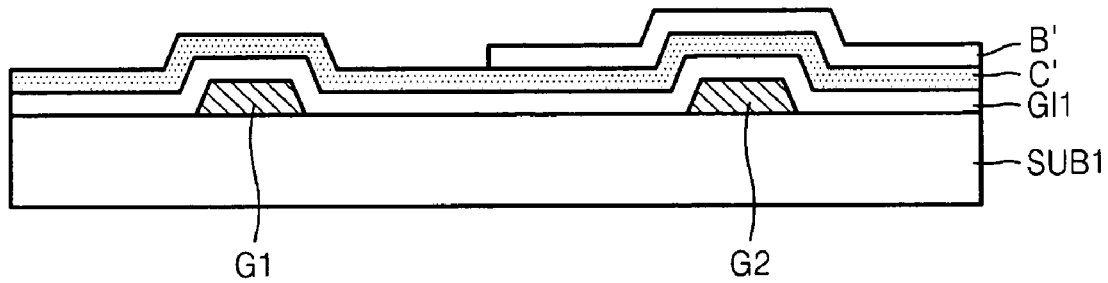

Referring to FIG. 11A, a first gate electrode G1 and a second gate electrode G2 may be formed on a substrate SUB1. A gate insulating layer GI1 covering the first and second gate electrodes G1 and G2 may be formed on the substrate SUB1. A channel material layer C' may be formed on an entire surface of the gate insulating layer GI1. A barrier material layer B' may be formed on the channel material layer C' above the second gate electrode G2.

The barrier material layer B' may have a work function that is greater than that of the channel material layer C'. The channel material layer C' may be formed of a first oxide semiconductor. The first oxide semiconductor may be a ZnO-based oxide semiconductor (e.g., ZnO, InZnO, GaInZnO, and ZnSnO). The channel material layer C' may include at least one transition metal selected from the group consisting of Hf, Cr, Ta, Y, Ti, Zr and combinations thereof.

The material forming the barrier material layer B' may vary according to the material forming the channel material layer C'. For example, the barrier material layer B' may be formed of at least one selected from the group consisting of a ZnO-based oxide layer having a larger work function than that of the channel material layer C', a Ti oxide layer, a Cu oxide layer, a Ni oxide layer, a Ni oxide layer doped with Ti, a ZnO-based oxide layer doped with at least one of I, II and V-group elements, a ZnO-based oxide layer doped with Ag and combinations thereof. Besides the above examples, other materials may be used to form the barrier material layer B'.

Figure 11B:
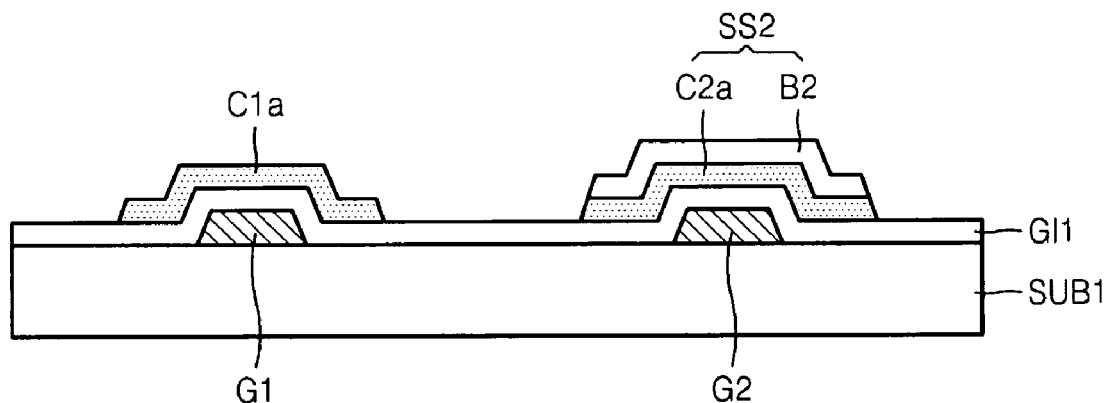

As shown in FIG. 11B, the barrier material layer B' and the channel material layer C' may be patterned to form a first channel layer C1a on the first gate electrode G1 and to form the second channel layer C2a and the barrier layer B2 on the second gate electrode G2. The second channel layer C2a and the barrier layer B2 form the stacked structure SS2.

In FIGS. 11A and 11B, the channel material layer C' may be formed on a part of the gate insulating layer GI1. The dual layer, which includes the channel material layer C' and the barrier material layer B', may be formed on another part of the gate insulating layer GI1. The channel material layer C' and the barrier layer B' may be patterned to form the first channel layer C1a and the stacked structure SS2. However, according to example embodiments, a single layer may be formed on the entire surface of the gate insulating layer GI1. A portion of the single layer may be changed to the dual-layered structure. The regions having the dual-layered structure and the single layer structure may be patterned to form the stacked structure SS2 and the first channel layer C1a, respectively.

Figure 11C:
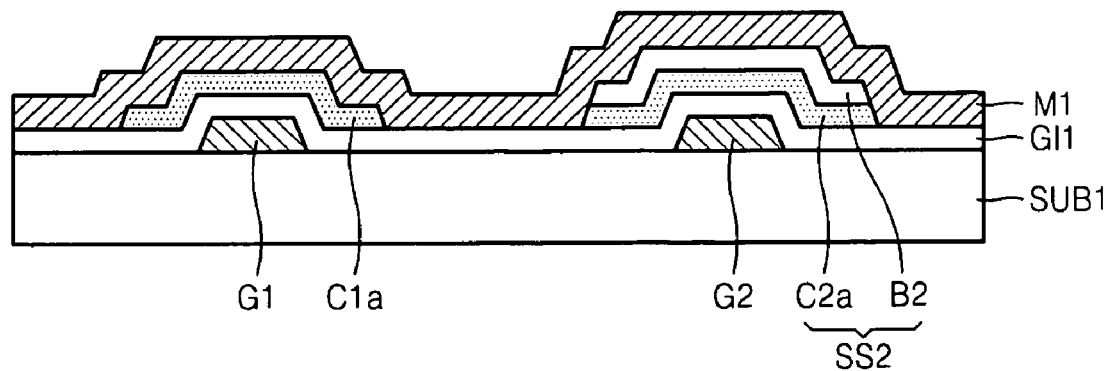

Referring to FIG. 11C, a source/drain electrode layer M1 covering the first channel layer C1a and the barrier layer B2 may be formed on the gate insulating layer GI1.

Figure 11D:
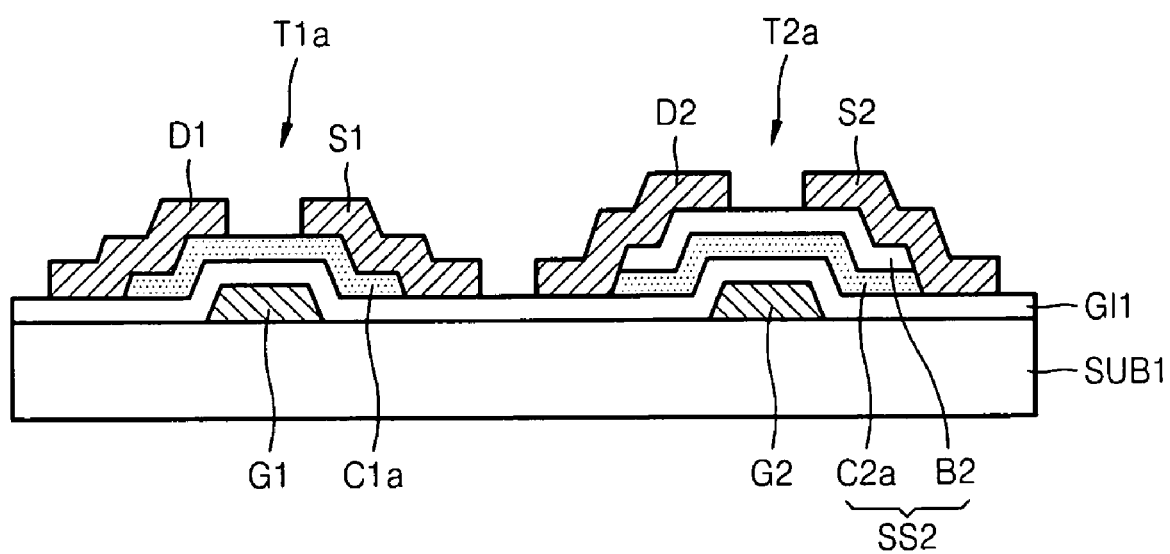

Referring to FIG. 11D, the source/drain electrode layer M1 may be patterned to form a first source electrode S1 and a first drain electrode D1, which contact respective ends of the first channel layer C1a. The source/drain electrode layer M1 may be patterned to form the second source electrode S2 and the second drain electrode D2, which contact respective ends of the barrier layer B2. The first source electrode S1 and the second drain electrode D2 may be separated from each other, or may be formed integrally.

The method illustrated in FIGS. 11A through 11D is a method of fabricating the inverter having the structure shown in FIG. 2. However, the inverters having the structures of FIGS. 3 and 4 may be fabricated by modifying the method illustrated in FIGS. 11A through 11D. For example, the method of fabricating the structure shown in FIG. 3 may include a process of forming a single channel material layer and changing a carrier concentration on a local part of the single channel material layer. Alternatively, the method of fabricating the structure shown in FIG. 3 may include a process of forming a first channel material layer on a first region and a second channel material layer on a second region. The second channel material layer may have a carrier concentration that is different from that of the first channel material layer. The method of fabricating the structure shown in FIG. 4 may include a process of forming a single channel material layer, and treating a local part of the single channel material layer with plasma (e.g., Ar plasma).

One of ordinary skill in the art would understand that the top gate thin film transistor structures shown in FIGS. 5 through 7 may be fabricated by modifying the above methods described above for fabricating the structures shown in FIGS. 2 through 4.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An inverter, comprising:
   a load transistor of a depletion mode, the load transistor having a first oxide layer as a first channel layer; and
   a driving transistor of an enhancement mode, the driving transistor being connected to the load transistor and having a second oxide layer as a second channel layer,
   wherein the driving transistor includes,
      a source electrode and a drain electrode both corresponding to the second oxide layer, and
      a barrier layer between the second oxide layer and the source electrode and the drain electrode, the barrier layer having a work function greater than that of the second oxide layer.

2. The inverter of claim 1, wherein the barrier layer is at least one selected from the group consisting of a titanium (Ti) oxide layer, a copper (Cu) oxide layer, a nickel (Ni) oxide layer, a Ni oxide layer doped with Ti, a ZnO-based oxide layer, a ZnO-based oxide layer doped with at least one of I, II and V-group elements, a ZnO-based oxide layer doped with silver (Ag) and combinations thereof.

3. The inverter of claim 1, wherein the first oxide layer and the second oxide layer are layers of the same material.

4. The inverter of claim 1, wherein the first oxide layer and the second oxide layer have different carrier concentrations.

5. The inverter of claim 4, wherein the second oxide layer has a carrier concentration lower than that of the first oxide layer.

6. The inverter of claim 1, wherein at least one of the first oxide layer and the second oxide layer includes a ZnO-based material.

7. The inverter of claim 1, wherein at least one of the load transistor and the driving transistor is a thin film transistor having a bottom gate structure.

8. The inverter of claim 1, wherein at least one of the load transistor and the driving transistor is a thin film transistor having a top gate structure.

9. A logic circuit comprising the inverter according to claim 1.

10. The logic circuit of claim 9, wherein the logic circuit is a not-and (NAND) circuit, a not-or (NOR) circuit, an encoder, a decoder, a multiplexer (MUX), a demultiplexer (DEMUX) or a sense amplifier.

* * * * *